United States Patent [19]

Hardell, Jr. et al.

[11] Patent Number: 5,327,548

[45] Date of Patent: Jul. 5, 1994

[54] APPARATUS AND METHOD FOR STEERING SPARE BIT IN A MULTIPLE PROCESSOR SYSTEM HAVING A GLOBAL/LOCAL MEMORY ARCHITECTURE

[75] Inventors: William R. Hardell, Jr.; James D. Henson, Jr., both of Austin; Oscar R. Mitchell, Pflugerville, all of Tex.

[73] Assignee: International Business Machines Corporation, Armonk, N.Y.

[21] Appl. No.: 973,356

[22] Filed: Nov. 9, 1992

[51] Int. Cl.⁵ .................... G06F 11/00; G06F 12/00
[52] U.S. Cl. ...................... 395/425; 395/575; 395/700; 364/DIG. 1; 364/280.2; 364/266.5; 364/268.9; 364/269.2; 364/961; 364/944; 364/944.61; 364/944.92; 364/945
[58] Field of Search ............... 395/650, 200, 700, 425, 395/575; 371/10.2

[56] References Cited

U.S. PATENT DOCUMENTS

| | | | |
|---|---|---|---|
| 4,253,146 | 2/1981 | Bellamy et al. | 364/200 |
| 4,438,494 | 3/1984 | Budde et al. | 364/DIG. 1 |
| 4,608,687 | 8/1986 | Dutton | 371/10 |
| 4,965,717 | 10/1990 | Cutts, Jr. et al. | 364/200 |
| 4,972,314 | 11/1990 | Getzinger et al. | 364/200 |
| 5,099,418 | 3/1992 | Pian et al. | 395/650 |
| 5,134,616 | 7/1992 | Barth, Jr. et al. | 371/10.2 |
| 5,163,133 | 11/1992 | Morgan et al. | 395/800 |
| 5,199,033 | 3/1993 | McGeoch et al. | 371/10.2 |
| 5,204,938 | 4/1993 | Skapura et al. | 395/27 |

OTHER PUBLICATIONS

IBM Technical Disclosure Bulletin, vol. 33, No. 9, Feb., 1991–"System Support for Multiprocessing Without an Atomic Storage", pp. 18–23.

Primary Examiner—Eddie P. Chan
Attorney, Agent, or Firm—Casimer K. Salys

[57] ABSTRACT

A system and method for managing spare bit steering information in a multi-processor system having a global/local memory architecture. During the system boot cycle one of the multiple processors is selected to test global memory and to configure the steering of the spare bits by bank or the like. Each processor tests its own local memory and defines the associated spare bit steering for the local memory. The global memory spare bit steering configuration information, as well as other global memory configuration information, in the selected processor is distributed to the other processors using registers in a commonly accessible atomic semaphore controller or through a commonly accessible block of global memory. Preferably, the selection of the processor to test the global memory is performed so that no single processor always has the responsibility. In this way, the acquisition of global memory spare bit steering information is not linked to the operative status of any one processor.

12 Claims, 3 Drawing Sheets

APPARATUS AND METHOD FOR STEERING SPARE BIT IN A MULTIPLE PROCESSOR SYSTEM HAVING A GLOBAL/LOCAL MEMORY ARCHITECTURE

CROSS-REFERENCE TO RELATED APPLICATIONS

The present invention is related to co-pending U.S. patent application Ser. No. 07/969,596, filed Oct. 30, 1992, having title "APPARATUS AND METHOD FOR BOOTING A MULTIPLE PROCESSOR SYSTEM HAVING A GLOBAL/LOCAL MEMORY ARCHITECTURE", and having common inventorship and assignee.

BACKGROUND OF THE INVENTION

The present invention relates in general to computer system memories. More particularly, the invention is directed to systems and methods for using spare bits in the context of a global memory shared by a multiplicity of processors.

Systems composed of multiple but coordinated processors were first developed and used in the context of mainframes. More recently, interest in multiple processor systems has escalated as a consequence of the low cost and high performance of microprocessors, with the objective of replicating mainframe performance through the parallel use of multiple microprocessors.

A variety of architectures have been defined for multi-processor systems. Most designs rely upon highly integrated architectures by virtue of the need for cache coherence. In such systems, cache coherence is maintained through complex logic circuit interconnection of the cache memories associated with the individual microprocessors to ensure data consistency as reflected in the various caches and main memory.

A somewhat different approach to architecting a multi-processor system relies upon a relatively loose hardware level coupling of the individual processors, with the singular exception of circuit logic controlling access to the shared global memory, and the use of software to manage cache coherence. An architecture which relies upon software managed cache coherence allows the designer to utilize existing processor hardware to the maximum extent, including the utilization of memory error correction resources such as bank related spare bit steering and data error correction code (ECC) memory configurations. This relative independence of the processors also lends itself to multi-processor systems with extenuated levels of availability, in that one or more processors may be disconnected without disrupting the operation of the remaining processors. Coordination in the access to, and coherency with, a shared global memory is of course somewhat more difficult when the processors are not closely coupled.

One problem that arises with a shared global memory, loosely coupled, multi-processor architecture relates to the management of error detection and correction resources. In such context, the designation and coordinated use of spare bits as well as error correction code bits must be consistent from processor to processor, so that the data in global memory is both consistent and reliable.

SUMMARY OF THE INVENTION

The present invention defines a system and method for steering spare bits in a multi-processor architecture having global memory resources, being comprised of a means for selecting a first processor to define the steering of spare bits in global memory, a means for enabling processors to define the steering of spare bits in respective local memories, and means for transferring global memory spare bit steering information from the first processor to other processors.

In a preferred practice of the invention, the first of the multi-processors reaching a specified stage in the booting process is assigned responsibility for testing both its local memory and the global memory. The remaining processors test only their respective local memory arrays. The bit steering information derived by the selected processor is thereafter conveyed to each of the other processors as a part of ensuring that the memory spare bit steering is consistent from processor to processor for the global memory. Local memory bit steering is individualized to the associated processor.

The global memory spare bit steering information is conveyed from the selected processor which performs the global memory test to the remaining processors in either of two manners, as preferably embodied. The first involves transfer through semaphore related registers in an atomic semaphore controller connected to all of the processors. In another form, spare bit steering and bank configuration information is fundamentally conveyed from the processor testing global memory to the other processors in the multi-processor system through a specially allocated block of global memory. Limited setup and global memory pointer information is passed through the atomic semaphore controller in the second form. Both systems and methods distribute for common use an identical set of spare bit steering and memory configuration information.

The benefits and features of the systems and methods to which the present invention pertains will be more clearly understood and appreciated upon considering the ensuing description of a detailed embodiment.

BRIEF DESCRIPTION OF THE PREFERRED EMBODIMENT

Figure 1:
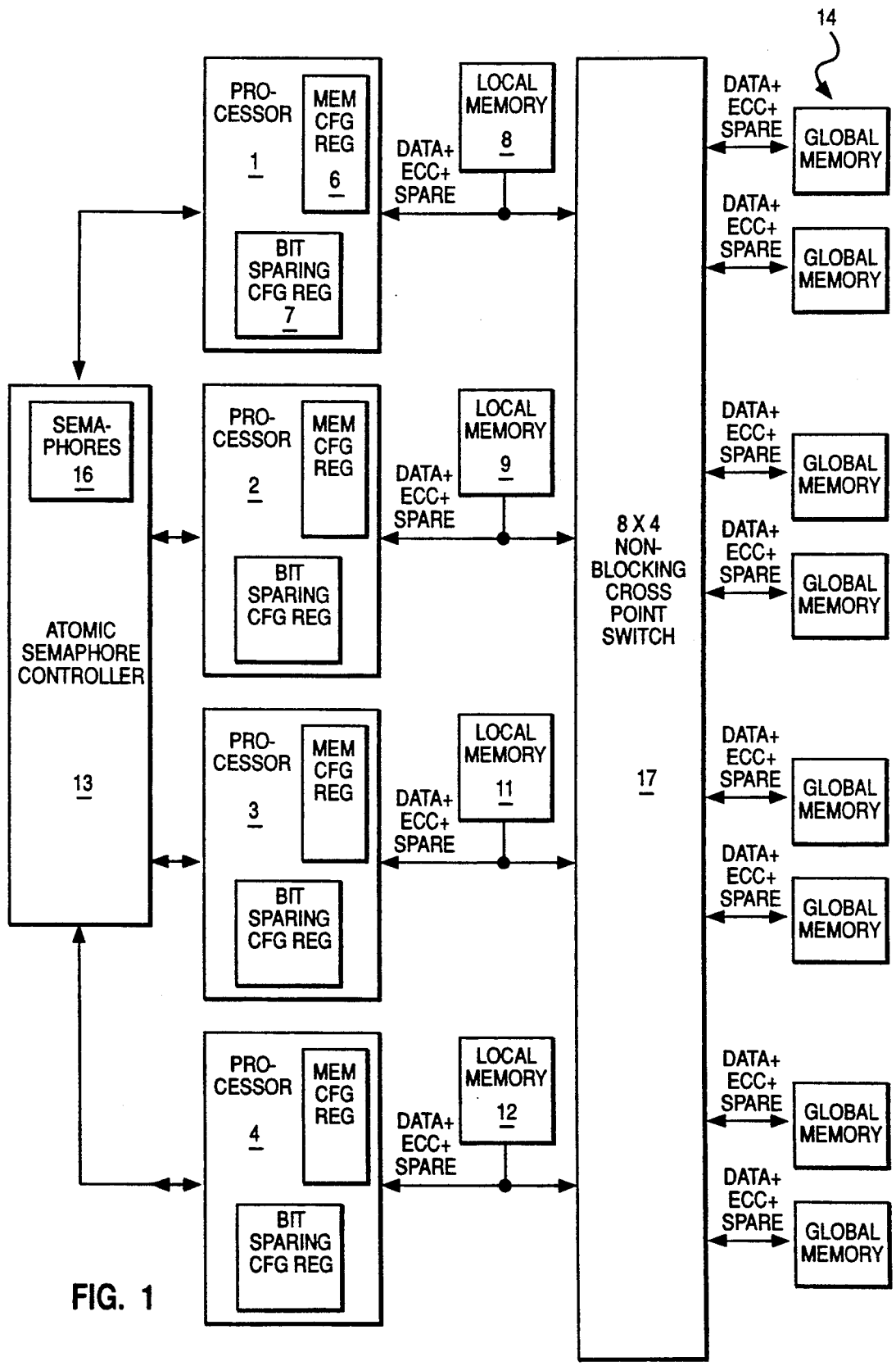
FIG. 1 is a schematic block diagram of a multiprocessor system.

FIG. 1 illustrates by schematic block diagram an architecture for the multi-processor to which the present invention pertains. Included within the system are four processors, identified by reference numerals 1–4. A representative example of a processor is the RISC System/6000 workstation with associated AIX Operating System as is commercially available from IBM Corporation. Each processor 1–4 includes memory configuration register 6 and bit steering configuration register 7, which registers store memory array starting address and size information in the memory configuration register, and spare bit steering by bank information in the bit steering configuration register. Associated with each processor 1–4 are locally addressable memory arrays, respectively identified by reference numerals 8, 9, 11 and 12. Though not explicitly shown, each processor also includes a cache type memory for both instructions and data. As noted earlier, cache coherency is managed by software in a manner to be described hereinafter. Atomic semaphore controller 13 in FIG. 1 allows software to coordinate access to the global memory array, generally at 14. Controller 13 includes a number of lockable semaphore type registers 16. During operation, controller 13 only allows one processor at a time to acquire exclusive access to a semaphore register. However, different processors may own different semaphores at the same time, and each processor may own more than one semaphore at a time. Software uses the semaphores to allocate processor access to the different blocks or banks of global memory. Software also introduces cache flush cycles to maintain global memory coherence between the various processor caches.

Non-blocking crosspoint switch 17 uses a relatively conventional design to allow processors 1-4 direct access to all parts of global memory array 14, in the absence of any address contentions. The processors are thereby able to concurrently communicate with the global memory in all but localized contention situations.

Figure 2:
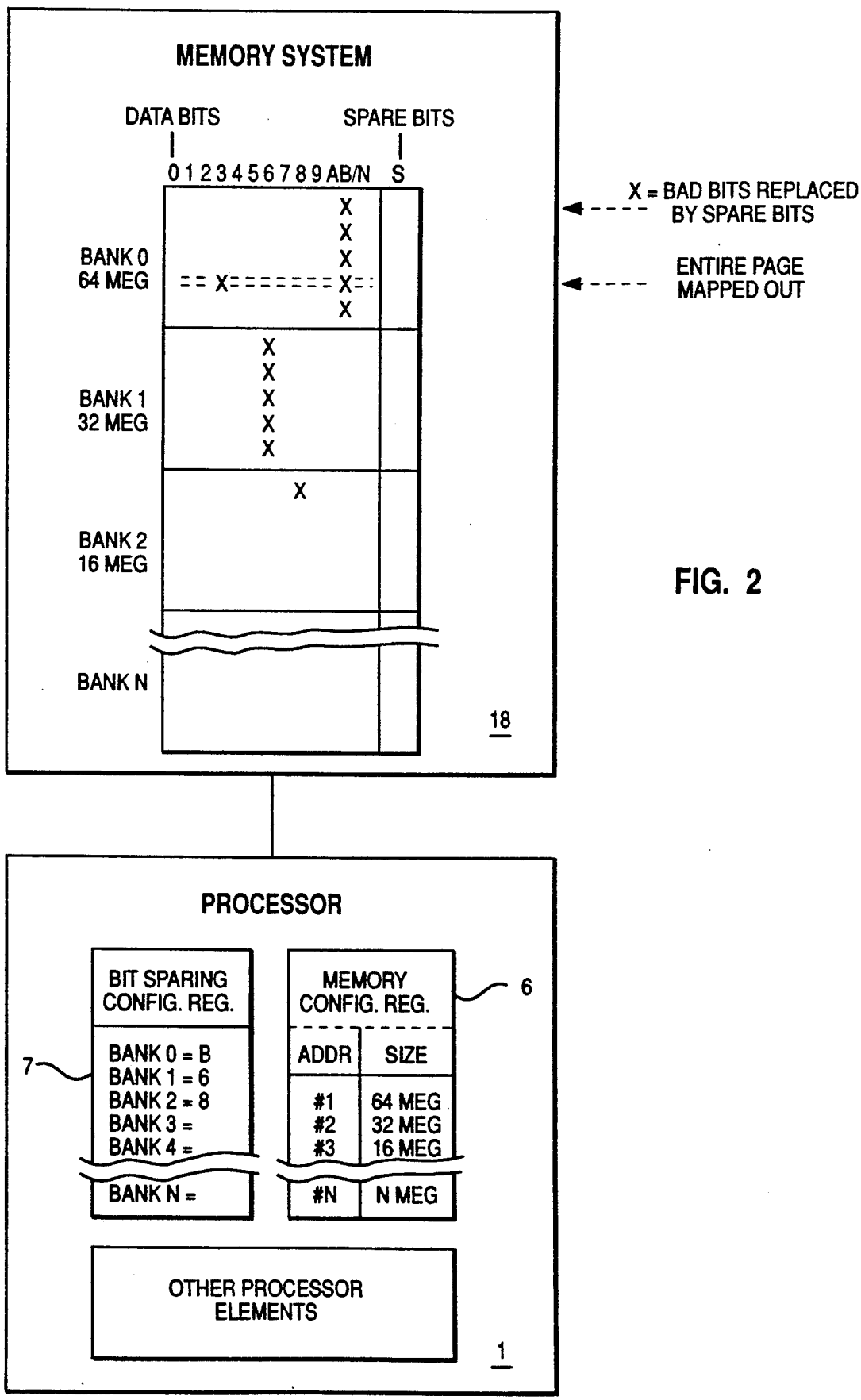
FIG. 2 schematically depicts the relationship between data in global memory and spare bit steering and memory configuration information as stored in configuration registers of the processors.

The generation, distribution and use of spare bit and memory configuration information is best understood with reference to FIG. 2. Block 18 depicts a composite, local and global, memory address range as viewed by a processor. Typically the first bank, Bank 0, is the local memory. Each bank of the memory is shown to include by row not only a string of data bits in columns 0-N, but also a spare bit column S. The data bits 0-N include both raw data and bits added for error correction, preferably adequate to identify two errors and to correct one. The presence of one, or possibly more than one, spare bit column ensures that hard defects in the memory array do not consistently consume the error correction code resources, given that those are usually included to manage soft errors.

In the illustrated memory block 18, bank 0 is composed of 64 megs and has, as shown, a single bad bit positioned in the third data bit column, and a further succession of five bad bits in the B data bit column. In this case, a single spare bit column is inadequate to substitute for both columns 3 and B, requiring that the whole of the page of memory be mapped out. Bank 1 is composed of 32 megs, and in this case has all five defective bits in column 6. The various processors when addressing bank 1 will be steered so that the data designated for a column 6 position is written to and read from the spare bit column S.

Note that the information about bank 0 and bank 1, as well as bank 2, appears in bit sparing configuration register 7 of processor 1. Memory configuration register 6 in processor 1 includes data regarding the sizes and starting addresses of the banks in memory system 18.

According to the present invention, the information in registers 6 and 7 of processor 1, which is presumed to be the processor which ran the global memory test by which the noted defects were identified, is distributed in identical form to each of the other processors in the multi-processor system. On the other hand, the corresponding form of information about the local memory associated with each respective processor is not distributed. The distribution of the information to corresponding registers in all of the multi-processors ensures a consistent view of global memory from each of the multiple processors while allowing fully individualized management of local memory.

The distribution of spare bit steering information and memory configuration information can be accomplished in various ways. Preferably, the register data is conveyed from the processor which performed the global memory test to the other processors in the system through a broadcast using semaphore registers 16 (FIG. 1). In the alterative, the spare bit steering and memory configuration information may be written to a designated block of global memory by the processor which tested global memory, and followed in individualized succession by a reading of such memory resident register data by each of the other three processors. In this practice of the invention, memory pointer and minimum configuration information is still passed through semaphores 16. Pointers are used to identify the block of global memory containing information, so that the location can be adjusted for global memory defects. The minimum configuration information specifies the global memory bank organization.

Figure 3:
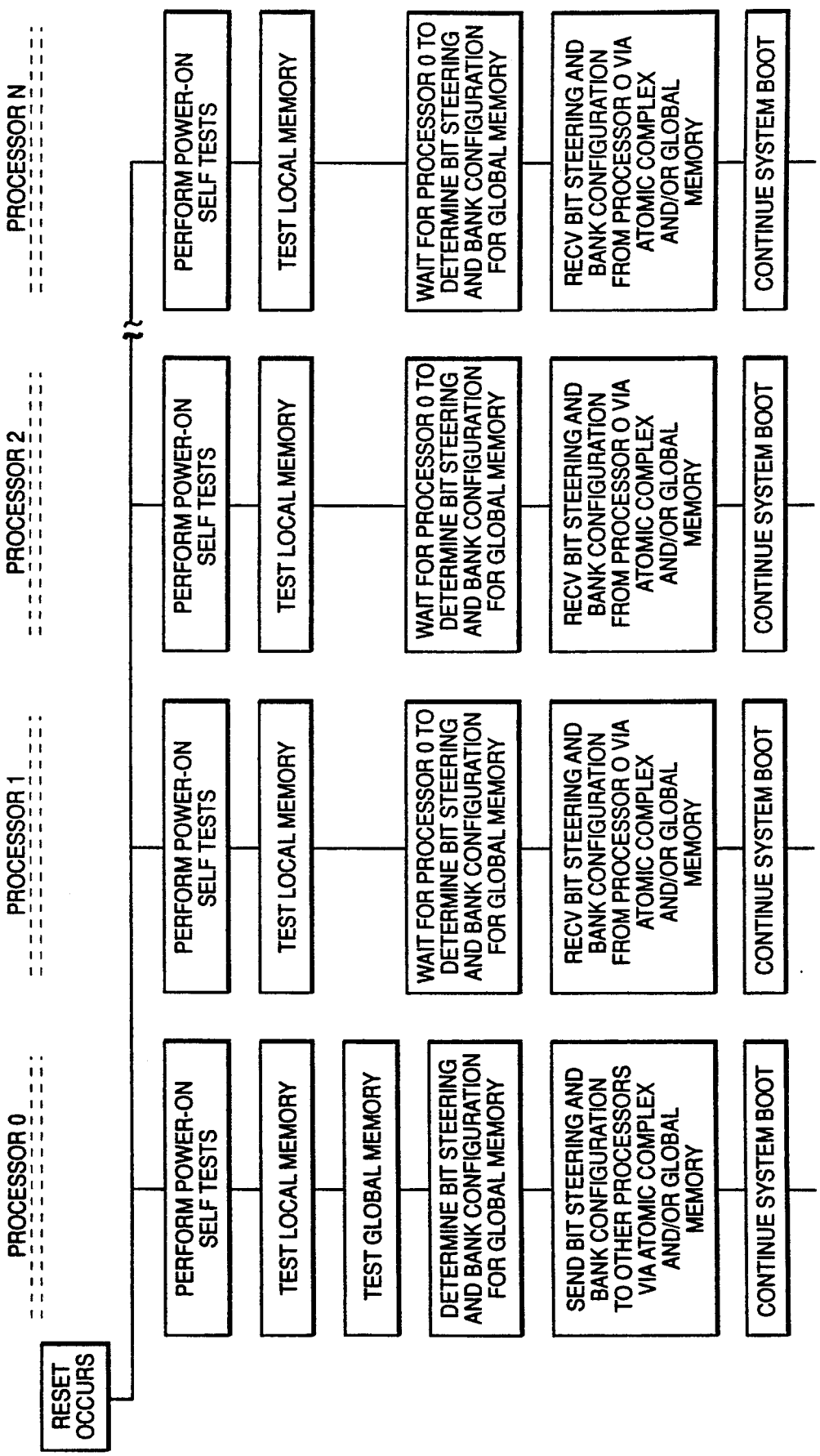
FIG. 3 illustrates by flow diagram the operations performed by the various processors in the embodying system.

FIG. 3 illustrates the sequences of operations in each of N associated processors. It is presumed that processor 0 acquires responsibility for testing global memory. Two aspects are worth noting. Since only one processor performs the test of global memory, and determines the associated bit steering and bank configuration, the delays and potential inconsistencies associated with having each processor perform a similar test are obviated. Secondly, note by the parallelism of the operations performed in the various processors that one or more of the processors could be disconnected or disabled without inhibiting of the operation of the remaining processors. Since the first processor to reach a certain stage in the booting process assumes the responsibilities of processor 0, the parallel character always remains intact.

In reflection, it should be apparent that the system and related method to which the present invention pertains ensures consistency of global array memory spare bit steering in the context of a loosely coupled multiprocessor system coordinated through software management of both semaphore registers in an atomic semaphore controller and cache coherence. Spare bit and memory configuration information is derived by a selected processor and distributed either through the atomic semaphore controller or through a commonly accessible block of global memory. The relative independence of the processors provides extenuated system level operational redundancy.

Though the invention has been described and illustrated by way of a specific embodiment, the systems and methods encompassed by the invention should be interpreted consistent with the breadth of the claims set forth hereinafter.

What is claimed is:

1. Apparatus for steering spare bits in a multi-processor system having local and global memory, comprising:
   means for selecting a first of multiple processors, selected by the processor first reaching a certain stage in a booting process, to test both first processor local memory and global memory, thereby determining the spare bit needs of the global memory;
   means for generating address information to steer spare bits in first processor local memory and global memory;
   means for enabling processors, other than the first processor, having local memory to specify by address information the steering of spare bits in respective local memory; and means for transferring the address information relating to the steering of spare bits in global memory from the first processor to other of the multiple processors, thereby obviating the need for others of the multiple processors to test the global memory.

2. The apparatus recited in claim 1, wherein the means for transferring address information is a processor interface controller which stores the address information in a form accessible to the multiple processors.

3. The apparatus recited in claim 2, wherein the data stored in the global memory includes error correction code bits.

4. The apparatus recited in claim 1, wherein the means for transferring address information comprises a block in the global memory accessible to the multiple processors.

5. The apparatus recited in claim 4, wherein the data stored in the global memory includes error correction code bits.

6. The apparatus recited in claim 4, further comprising a means for transferring address pointers to the processors without using the block in the global memory.

7. A method of steering spare bits in a multi-processor system having local and global memory, comprising the steps of:

selecting a first of multiple processors, selected by the processor first reaching a certain stage in a booting process, to test both first processor local memory and global memory, thereby determining the spare bit needs of the global memory;

generating address information to steer spare bits in first processor local memory and global memory;

enabling processors, other than the first processor, having local memory to specify by address information the steering of spare bits in respective local memory; and transferring the address information relating to the steering of spare bits in global memory from the first processor to other of the multiple processors, thereby obviating the need for others of the multiple processors to test the global memory.

8. The method recited in claim 7, wherein the step of transferring address information is performed through a processor interface controller which stores the address information in a form accessible to the multiple processors.

9. The method recited in claim 8, wherein the data stored in the global memory includes error correction code bits.

10. The method recited in claim 7, wherein the step of transferring address information is substantially through a block of the global memory accessible to the multiple processors.

11. The method recited in claim 10, wherein the data stored in the global memory includes error correction code bits.

12. The method recited in claim 10, further comprising the step of transferring address pointers to the processors without using the block in the global memory.

* * * * *